United States Patent
Murakami et al.

(10) Patent No.: US 9,705,602 B2
(45) Date of Patent: Jul. 11, 2017

(54) OPTICAL TRANSMISSION MODULE AND OPTICAL TRANSCEIVER

(71) Applicant: Oclaro Japan, Inc., Kanagawa (JP)

(72) Inventors: Daisuke Murakami, Kanagawa (JP); Takayuki Hasegawa, Kanagawa (JP)

(73) Assignee: OCLARO JAPAN, INC., Kanagawa (JP)

( * ) Notice: Subject to any disclaimer, the term of this patent is extended or adjusted under 35 U.S.C. 154(b) by 0 days.

(21) Appl. No.: 15/054,408

(22) Filed: Feb. 26, 2016

(65) Prior Publication Data
US 2016/0261348 A1 Sep. 8, 2016

(30) Foreign Application Priority Data
Mar. 4, 2015 (JP) .................. 2015-042511

(51) Int. Cl.
| | |
|---|---|
| H04B 10/00 | (2013.01) |
| H04B 10/548 | (2013.01) |
| H04B 10/40 | (2013.01) |
| H04B 10/50 | (2013.01) |
| H01S 5/024 | (2006.01) |
| H01S 5/026 | (2006.01) |

(Continued)

(52) U.S. Cl.
CPC .......... *H04B 10/548* (2013.01); *H04B 10/40* (2013.01); *H04B 10/503* (2013.01); *H01S 5/0265* (2013.01); *H01S 5/02415* (2013.01); *H01S 5/0427* (2013.01); *H01S 5/2216* (2013.01)

(58) Field of Classification Search
CPC .... H04B 10/40; H04B 10/503; H04B 10/548; H04B 10/564; H04B 10/50; H04B 10/07955; H01S 5/02415; H01S 5/024; H01S 5/00; H01S 5/0265; H01S 5/0427; H01S 5/2216; H01S 5/022; G02B 6/4201; G02B 6/42; G02B 6/4244
USPC ....... 398/135–139, 162, 164, 182, 183, 192, 398/195–198
See application file for complete search history.

(56) References Cited

U.S. PATENT DOCUMENTS

| | | | |
|---|---|---|---|
| 6,713,862 B2 * | 3/2004 | Palanisamy | H01S 5/02248 174/252 |
| 7,426,225 B2 * | 9/2008 | Go | G02B 6/4201 257/98 |

(Continued)

FOREIGN PATENT DOCUMENTS

| | | | | |
|---|---|---|---|---|
| JP | 2012-244229 A | | 12/2012 | |
| JP | 2012244229 A | * | 12/2012 | ............. H04B 10/04 |

*Primary Examiner* — Hibret Woldekidan
(74) *Attorney, Agent, or Firm* — Mattingly & Malur, PC

(57) ABSTRACT

The optical transmission module, which is configured to input differential signals including a positive-phase signal and a negative-phase signal, includes: a laser oscillator configured to output laser light; an optical modulator configured to modulate the laser light based on the positive-phase signal; a negative-phase terminating resistor configured to terminate the negative-phase signal; a Peltier device including a first region and a second region in which heat is exchanged; a substrate mounted to the first region so that heat is conducted to the first region; and a package which is hermetically sealed, the laser oscillator and the optical modulator being mounted on the substrate so that heat is conducted to the first region, the negative-phase terminating resistor being arranged outside of the substrate so as to avoid conduction of heat to the first region.

15 Claims, 9 Drawing Sheets

(51) Int. Cl.
   *H01S 5/042*     (2006.01)
   *H01S 5/22*      (2006.01)

(56) References Cited

U.S. PATENT DOCUMENTS

| | | | | |
|---|---|---|---|---|
| 7,463,830 B2 * | 12/2008 | Whitehead | ............. | H04B 10/40 398/138 |
| 8,019,225 B2 * | 9/2011 | Daghighian | ........... | H04B 10/40 398/135 |
| 8,218,973 B2 * | 7/2012 | Kagaya | ............. | H04B 10/2504 398/164 |
| 8,582,978 B2 * | 11/2013 | Ekkizogloy | ............ | H04B 10/40 398/136 |
| 9,350,454 B2 * | 5/2016 | Xu | ....................... | G02B 6/4215 |
| 9,372,315 B2 * | 6/2016 | Miao | ...................... | H04B 10/40 |
| 9,608,405 B2 * | 3/2017 | Tanaka | .................... | H01S 5/042 |
| 2012/0051683 A1 * | 3/2012 | Sugiyama | ............... | G02F 1/035 385/1 |
| 2013/0003393 A1 * | 1/2013 | Chiba | .................... | H01L 33/52 362/373 |
| 2016/0030753 A1 * | 2/2016 | Shah | ................... | A61N 1/3752 607/116 |
| 2016/0380699 A1 * | 12/2016 | Tatsumi | ............... | H04B 10/516 330/286 |

\* cited by examiner

OPTICAL TRANSMISSION MODULE AND OPTICAL TRANSCEIVER

CROSS-REFERENCE TO RELATED APPLICATION

The present application claims priority from Japanese application JP 2015-042511, filed on Mar. 4, 2015, the content of which is hereby incorporated by reference into this application.

BACKGROUND OF THE INVENTION

1. Field of the Invention

The present invention relates to an optical transmission module and an optical transceiver.

2. Description of the Related Art

In some cases, an optical signal to be used in optical communication is generated by modulating laser light being a carrier wave with an optical modulator. Note that, as systems for modulating light, there are known a direct modulation system and an external modulation system. In the direct modulation system, a laser oscillator configured to output laser light performs modulation operation in response to a modulation signal. In the external modulation system, laser light output without being modulated is modulated with a modulator.

In Japanese Patent Application Laid-open No. 2012-244229, there is disclosed an optical transceiver including an optical module including an optical modulation unit configured to modulate light of a semiconductor laser device. The optical module includes a pair of main electrical signal transmission lines including a positive-phase signal transmission line and a negative-phase signal transmission line.

SUMMARY OF THE INVENTION

When the external modulation system is employed to generate the optical signal, the laser oscillator and the optical modulator are different from each other in degree of characteristic change with respect to operation temperature, and hence the laser oscillator and the optical modulator are often used by being driven at a constant temperature in order to obtain a stable optical signal. Therefore, in some cases, a Peltier device is used to control the temperature of each of the laser oscillator and the optical modulator.

However, power for driving the Peltier device becomes necessary in addition to power for driving each of the laser oscillator and the optical modulator. Therefore, power consumption is increased in some cases.

In view of this, the present invention has an object to provide an optical transmission module and an optical transceiver that are further reduced in power consumption.

(1) In order to solve the above-mentioned problem, according to one embodiment of the present invention, there is provided an optical transmission module, which is configured to input differential signals including a positive-phase signal and a negative-phase signal, the optical transmission module including: a laser oscillator configured to output laser light; an optical modulator configured to modulate the laser light based on the positive-phase signal; a negative-phase terminating resistor configured to terminate the negative-phase signal; a Peltier device including a first region and a second region in which heat is exchanged; a substrate mounted to the first region so that heat is conducted to the first region; and a package which is hermetically sealed and in which at least the laser oscillator, the optical modulator, the negative-phase terminating resistor, the Peltier device, and the substrate are arranged, the laser oscillator and the optical modulator being mounted on the substrate so that heat is conducted to the first region, the negative-phase terminating resistor being arranged outside of the substrate so as to avoid conduction of heat to the first region.

(2) The optical transmission module according to Item (1) further includes a feedthrough configured to pass through the package. In the optical transmission module, the negative-phase terminating resistor is arranged on the feedthrough.

(3) The optical transmission module according to Item (2) further includes a positive-phase terminating resistor configured to terminate the positive-phase signal. In the optical transmission module, the positive-phase terminating resistor is arranged on the feedthrough.

(4) The optical transmission module according to Item (1) further includes: a feedthrough configured to pass through the package; and a relay substrate arranged inside the package. In the optical transmission module, the negative-phase terminating resistor is arranged on the relay substrate.

(5) The optical transmission module according to Item (4) further includes a positive-phase terminating resistor configured to terminate the positive-phase signal. In the optical transmission module, the positive-phase terminating resistor is arranged on the relay substrate.

(6) The optical transmission module according to Item (3) or (5) further includes a transmission line arranged between the optical modulator and the positive-phase terminating resistor and configured to be impedance matched with each of the optical modulator and the positive-phase terminating resistor.

(7) The optical transmission module according to any one of Items (1) to (6) further includes a transmission line configured to transmit the input positive-phase signal to the optical modulator and configured to be impedance matched with the optical modulator.

(8) In the optical transmission module according to Item (3), (5), or (6), the positive-phase terminating resistor and the negative-phase terminating resistor are connected to one ground pattern.

(9) In the optical transmission module according to Item (8), the positive-phase terminating resistor and the negative-phase terminating resistor are connected to one conductor pattern, and are connected to the one ground pattern via a capacitor.

(10) In the optical transmission module according to any one of Items (1) to (9), the negative-phase terminating resistor is one of a chip resistor and a thin film resistor.

(11) There is provided an optical transceiver, including: the optical transmission module of any one of Items (1) to (10); an optical reception module; and a driver configured to output the differential signals, the driver being arranged outside of the package.

According to the one embodiment of the present invention, the optical transmission module and the optical transceiver that are further reduced in power consumption are provided.

DETAILED DESCRIPTION OF THE INVENTION

First Embodiment

Figure 1:
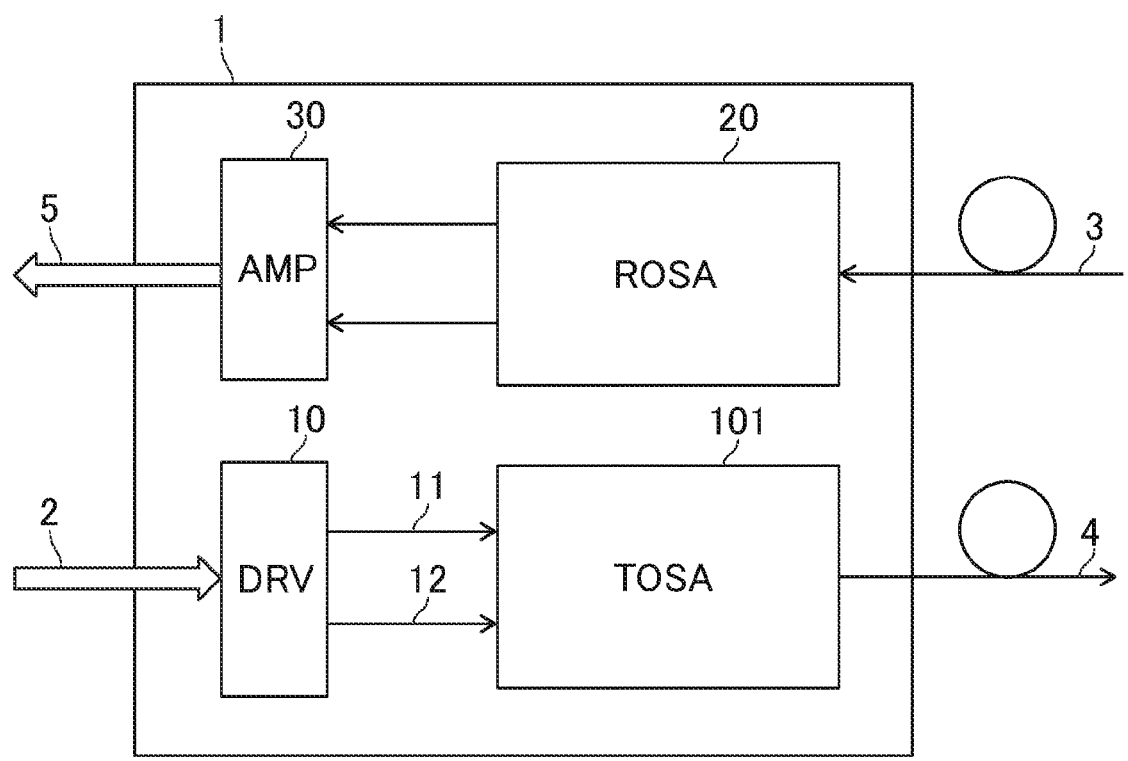
FIG. 1 is a configuration diagram of an optical transceiver according to a first embodiment of the present invention.

Embodiments of the present invention are specifically described in detail in the following with reference to the attached drawings. Note that, throughout the drawings for illustrating the embodiments, like reference numerals are used to represent members having like functions, and redundant description thereof is omitted. Note that, the drawings referred to in the following are only for illustrating the embodiments by way of examples, and are not necessarily drawn to scale.

FIG. 1 is a configuration diagram of an optical transceiver 1 according to a first embodiment of the present invention. The optical transceiver 1 according to this embodiment includes an amplifier (AMP) 30, a driver (DRV) 10, an optical reception module (ROSA, receiver optical sub-assembly) 20, and an optical transmission module (TOSA, transmitter optical sub-assembly) 101. The optical reception module 20 is configured to input an input optical signal 3 through an optical fiber, to thereby convert the input optical signal 3 into an electrical signal. The electrical signal output from the optical reception module 20 is input to the amplifier 30 to be amplified, and the amplified electrical signal is then output as an output signal 5 to the outside of the optical transceiver 1. Further, an input signal 2 that is an electrical signal is input to the driver 10 from the outside of the optical transceiver 1. The driver 10 is configured to output differential signals that are electrical signals, which are input to the optical transmission module 101. The optical transmission module 101 is configured to convert the electrical signal into an optical signal, to thereby output an output optical signal 4 to a connected optical fiber. In the optical transceiver 1 according to this embodiment, the amplifier 30, the driver 10, the optical reception module 20, and the optical transmission module 101 are collectively arranged inside a single package. As described later, each of the optical reception module 20 and the optical transmission module 101 is hermetically sealed in order to secure reliability. Therefore, the package forming the optical transceiver 1 may not be hermetically sealed.

In the optical transceiver 1 according to this embodiment, the driver 10 is arranged outside of the package of the optical transmission module 101. If the driver 10 is arranged inside of the package of the optical transmission module 101, heat generated by the driver 10 during drive may affect operations of a laser oscillator and an optical modulator included in the optical transmission module 101. In the optical transceiver 1 according to this embodiment, the driver 10 is arranged outside of the package of the optical transmission module 101. Therefore, even when the driver 10 generates heat, the influence on the optical transmission module 101 is reduced.

Note that, in the optical transceiver 1 according to this embodiment, the optical reception module 20 and the optical transmission module 101 are separate modules, but a module having both an optical transmission function and an optical reception function (so-called BOSA, bidirectional optical sub-assembly) may be employed instead.

Note that, in the optical transmission module 101 according to this embodiment, one of the differential signals (positive-phase signal) is used to modulate the laser light by the external modulation system. By employing the configuration of inputting the differential signals to the optical transmission module 101, there is an advantage in that the optical transmission module 101 can be substituted with a module of the direct modulation system without changing the configuration of the optical transceiver 1.

Figure 2:
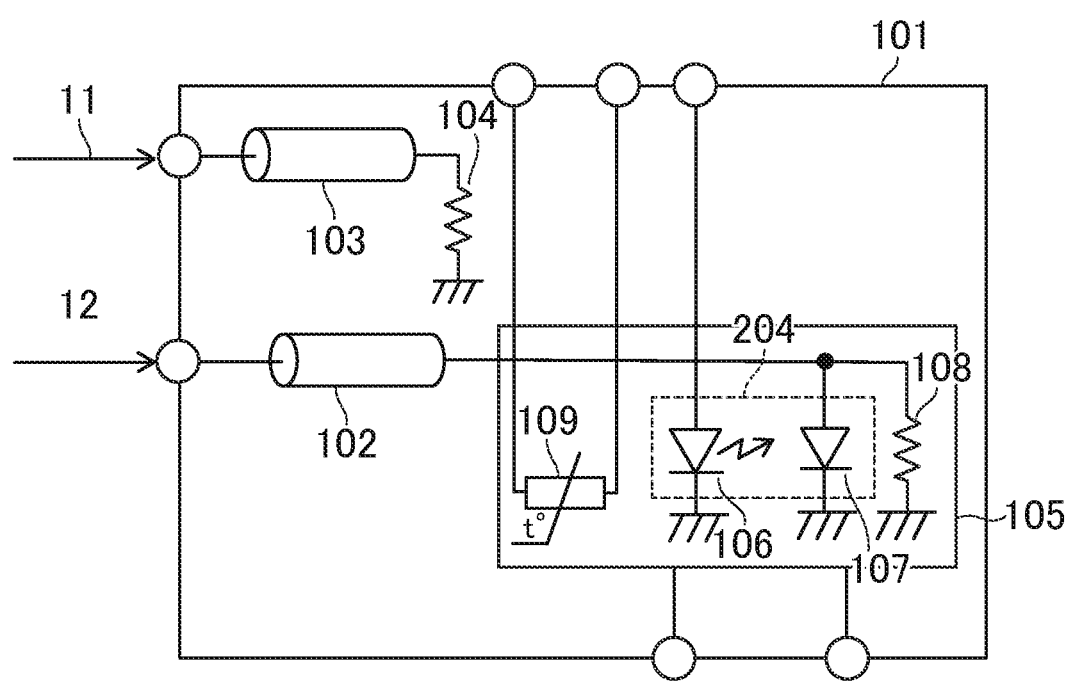
FIG. 2 is a configuration diagram of an optical transmission module according to the first embodiment of the present invention.

FIG. 2 is a configuration diagram of the optical transmission module 101 according to the first embodiment of the present invention. The optical transmission module 101 is configured to input, from the driver 10, the differential signals including a positive-phase signal 12 and a negative-phase signal 11. Further, the optical transmission module 101 includes a laser diode 106 (laser oscillator) configured to output laser light, and an electro-absorption (EA) modulator (optical modulator) 107 configured to modulate the laser light based on the positive-phase signal 12. The laser diode 106 and the EA modulator 107 are formed on one semiconductor substrate, and construct an EA modulator integrated laser oscillator 204. The EA modulator 107 is connected in parallel to a positive-phase terminating resistor 108 configured to terminate the positive-phase signal 12. Note that, in this embodiment, one of the differential signals input to the EA modulator 107 is referred to as the positive-phase signal, and the other thereof not input to the EA modulator 107 is referred to as the negative-phase signal, but those names are set only for the sake of convenience, and the signals may be called with names having opposite positive and negative phases.

The optical transmission module 101 according to this embodiment includes a negative-phase terminating resistor 104 configured to terminate the negative-phase signal 11. As illustrated in the next figure, the optical transmission module 101 includes a package made of a conductive material such as a metal. In this case, at the outside of the package of the optical transmission module 101, an electromagnetic field generated by the negative-phase signal 11 and an electromagnetic field generated by the positive-phase signal 12 cancel each other out, and thus a radiation amount of the electromagnetic wave can be suppressed low. Further, even when the electromagnetic wave is generated inside of the package of the optical transmission module 101, the package functions as an electromagnetic shield, and hence the electromagnetic wave is prevented from leaking outside of the package. In general, the amount of the electromagnetic wave radiated from the optical transceiver 1 is required to be suppressed to be a certain level or lower. Employment of the structure of this embodiment enables suppression of the electromagnetic wave radiated from the optical transceiver 1.

The EA modulator integrated laser oscillator 204 and the positive-phase terminating resistor 108 are formed on a substrate 105. Further, a thermistor 109 is formed on the substrate 105. In the optical transmission module 101 according to this embodiment, the thermistor 109 is configured to measure the temperature of the substrate 105, and a Peltier device to be described later is configured to control the temperature of the substrate 105. In this case, controlling the temperature of the substrate 105 has the same meaning as controlling the temperature of the EA modulator integrated laser oscillator 204.

Figure 3:
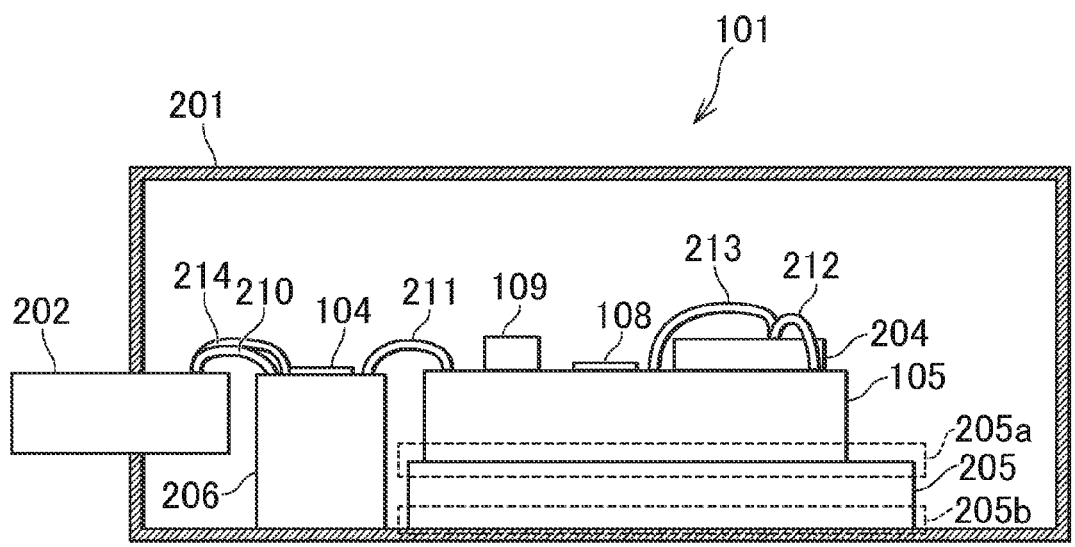
FIG. 3 is an internal side view of the optical transmission module according to the first embodiment of the present invention.
Figure 4:
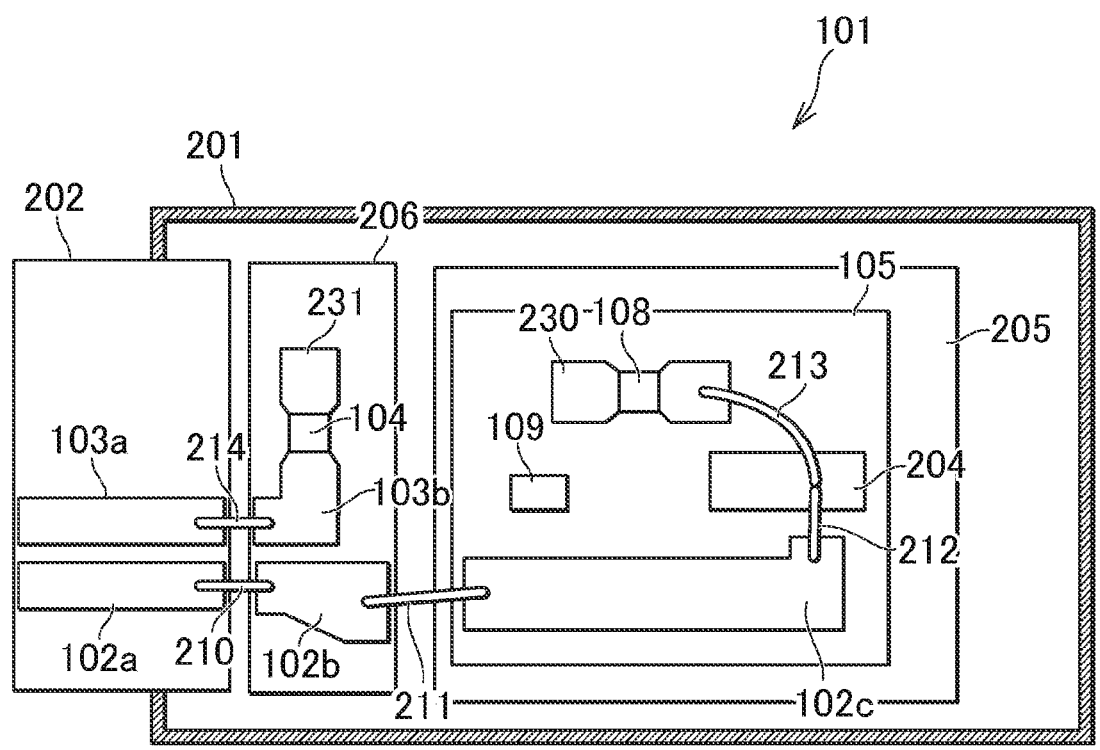
FIG. 4 is an internal top view of the optical transmission module according to the first embodiment of the present invention.

FIG. 3 is an internal side view of the optical transmission module 101 according to the first embodiment of the present invention. FIG. 3 is an illustration of a lateral side of the inside of a package 201 of the optical transmission module 101. Further, FIG. 4 is an internal top view of the optical transmission module 101 according to the first embodiment of the present invention. FIG. 4 is an illustration of a top side of the inside of the package 201 of the optical transmission module 101. Inside the package 201 of the optical transmission module 101 according to this embodiment, the EA modulator integrated laser oscillator 204, the negative-phase terminating resistor 104, a Peltier device 205, a relay substrate 206, the positive-phase terminating resistor 108, the thermistor 109, a plurality of transmission lines, and the substrate 105 are arranged. Inside the package 201 of the optical transmission module 101, at least the laser oscillator (laser diode 106), the optical modulator (EA modulator 107), the negative-phase terminating resistor 104, the Peltier device 205, and the substrate 105 are arranged. The package 201 made of a conductive material such as a metal is hermetically sealed under a state of being filled with an inert gas such as nitrogen in order to secure reliability of the elements arranged inside. In the optical transmission module 101 according to this embodiment, the EA modulator integrated laser oscillator 204 in which the laser diode 106 and the EA modulator 107 are integrally formed is provided, but the laser diode 106 and the EA modulator 107 may be provided separately.

The optical transmission module 101 includes a feedthrough 202 configured to pass through the package 201. The feedthrough 202 is made of ceramics, and a first negative-phase transmission line 103a configured to transmit the negative-phase signal 11 and a first positive-phase transmission line 102a configured to transmit the positive-phase signal 12 are formed inside the feedthrough 202. The transmission line is formed of, for example, a line obtained by subjecting tantalum nitride to gold plating, and may be a micro-strip line or a coplanar line. Note that, the feedthrough 202 is brought into contact with the package 201 made of a conductive material, and hence the transmission lines are formed inside the feedthrough 202 instead of on the surface. In FIG. 4, however, for concise description, the first positive-phase transmission line 102a and the first negative-phase transmission line 103a are illustrated on the feedthrough 202.

The optical transmission module 101 includes the relay substrate 206 which is arranged inside the package 201 and has a surface smoother than that of the feedthrough 202. The relay substrate 206 is made of ceramics, and, in this embodiment, is arranged on the bottom surface of the package 201 (surface on which the Peltier device 205 is arranged). The relay substrate 206 may be arranged on the feedthrough 202 in an overlapping manner. On the relay substrate 206, a second negative-phase transmission line 103b and a second positive-phase transmission line 102b are formed. The second negative-phase transmission line 103b and the second positive-phase transmission line 102b are connected to the first negative-phase transmission line 103a and the first positive-phase transmission line 102a formed on the feedthrough 202 via a fifth bonding wire 214 and a first bonding wire 210, respectively.

On the package 201 of the optical transmission module 101, the Peltier device 205 having a first region 205a and a second region 205b in which heat is exchanged is arranged. The Peltier device 205 is configured to transport heat from the first region 205a to the second region 205b. That is, when the EA modulator integrated laser oscillator 204 is cooled as in this embodiment, the first region 205a is a low temperature region, and the second region 205b is a high temperature region. When the EA modulator integrated laser oscillator 204 is heated, the low temperature region and the high temperature region are reversed. Note that, when a general optical transmission module (optical transceiver) is actually driven, the stable operation temperature for the EA modulator integrated laser oscillator is lower than the external environment temperature, and hence the EA modulator integrated laser oscillator is often cooled. The substrate 105 is mounted on the first region 205a of the Peltier device 205 so that heat is conducted to the first region 205a. The substrate 105 is made of a material having good thermal conductivity such as an aluminum nitride (AlN) metal, and the EA modulator integrated laser oscillator 204 is mounted on the substrate 105 so that heat is conducted to the first region 205a.

The laser diode 106 and the EA modulator 107 included in the EA modulator integrated laser oscillator 204 are different from each other in degree of characteristic change with respect to temperature. Therefore, when the laser diode 106 generates heat to increase the temperature of the EA modulator integrated laser oscillator 204, the wavelength of laser light oscillated by the laser diode 106 and the wavelength suitable for modulation in the EA modulator 107 may be deviated from values assumed during design. In view of this, in the optical transmission module 101 according to this embodiment, in order to keep the laser diode 106 and the EA modulator 107 at a constant temperature, the Peltier device 205 is provided.

On the substrate 105, a third positive-phase transmission line 102c configured to transmit the positive-phase signal 12 is formed. The third positive-phase transmission line 102c is connected to the second positive-phase transmission line 102b via a second bonding wire 211. Further, the positive-phase signal 12 is transmitted from the third positive-phase transmission line 102c to the EA modulator 107 included in the EA modulator integrated laser oscillator 204 via a third bonding wire 212.

The first positive-phase transmission line 102a, the second positive-phase transmission line 102b, and the third positive-phase transmission line 102c are transmission lines that are impedance matched with the optical modulator included in the EA modulator integrated laser oscillator 204, and are configured to transmit the input positive-phase signal 12 to the optical modulator. The positive-phase signal 12 is transmitted to the optical modulator with the impedance-matched transmission lines, and thus attenuation of the positive-phase signal 12 during the transmission process is suppressed.

On the substrate 105, the positive-phase terminating resistor 108 configured to terminate the positive-phase signal 12 is arranged. The positive-phase terminating resistor 108 has one end to which the positive-phase signal 12 is input via a fourth bonding wire 213 in parallel to the EA modulator integrated laser oscillator 204, and has the other end connected to a first ground pattern 230. The positive-phase terminating resistor 108 is formed of a thin film resistor. The positive-phase terminating resistor 108 may be formed of a chip resistor.

In the optical transmission module 101 according to this embodiment, the negative-phase terminating resistor 104 is arranged outside of the substrate 105 so as to avoid conduction of heat to the first region 205a. Specifically, the negative-phase terminating resistor 104 is arranged on the relay substrate 206. The negative-phase terminating resistor 104 is configured to terminate the negative-phase signal 11, and hence generates heat. With the optical transmission module 101 according to this embodiment, the negative-phase terminating resistor 104 being a heat generating element is arranged outside of the substrate 105 so as to reduce the heat amount to be transported by the Peltier device 205. Thus, power consumption of the optical transmission module 101 can be further reduced. In the optical transmission module 101 according to this embodiment, the component having the largest heat generation amount is the laser diode 106 included in the EA modulator integrated laser oscillator 204, and the component having the second largest heat generation amount is the negative-phase terminating resistor 104. When the negative-phase terminating resistor 104 is arranged outside of the substrate 105, the component having the second largest heat generation amount among the components arranged inside the package 201 is excluded from components whose temperature is to be controlled by the Peltier device 205. Therefore, the power consumption of the Peltier device 205 is reduced, and thus the power consumption of the optical transmission module 101 is reduced.

According to the demonstration experiments conducted by the inventors of the present invention, under a condition that the temperature of the package 201 was 80° C., the power consumption of the optical transmission module 101 of this embodiment was 350 mW. On the other hand, when the negative-phase terminating resistor 104 was arranged on the substrate 105 and under a condition that the temperature of the package 201 was 80° C., the power consumption was 360 mW. That is, with the optical transmission module 101 according to this embodiment, the power consumption can be reduced by about 2.8%. In this embodiment, a case where one EA modulator integrated laser oscillator 204 is included in the package 201 is described, but in recent years, a mode of incorporating a plurality of light sources such as four EA modulator integrated laser oscillators is increasingly employed. An optical transceiver in such a mode has a very severe restriction on power consumption. According to the invention of the present application, even when a plurality of light sources are incorporated in the package, power consumed in each of the EA modulator integrated laser oscillators can be reduced, and hence a larger effect can be obtained.

In the optical transmission module 101 according to this embodiment, the negative-phase terminating resistor 104 is formed of a thin film resistor. The thin film resistor may be formed of, for example, a thin film of tantalum nitride. In this embodiment, the negative-phase terminating resistor 104 is arranged on the relay substrate 206. The relay substrate 206 has a smoother surface and thus a better metal wettability as compared to the feedthrough 202, and hence the thin film resistor can be easily formed thereon. As a matter of course, the negative-phase terminating resistor 104 may be formed of a chip resistor. One end of the negative-phase terminating resistor 104 is connected to the second negative-phase transmission line 103b, and the other end thereof is connected to a second ground pattern 231.

Second Embodiment

Figure 5:
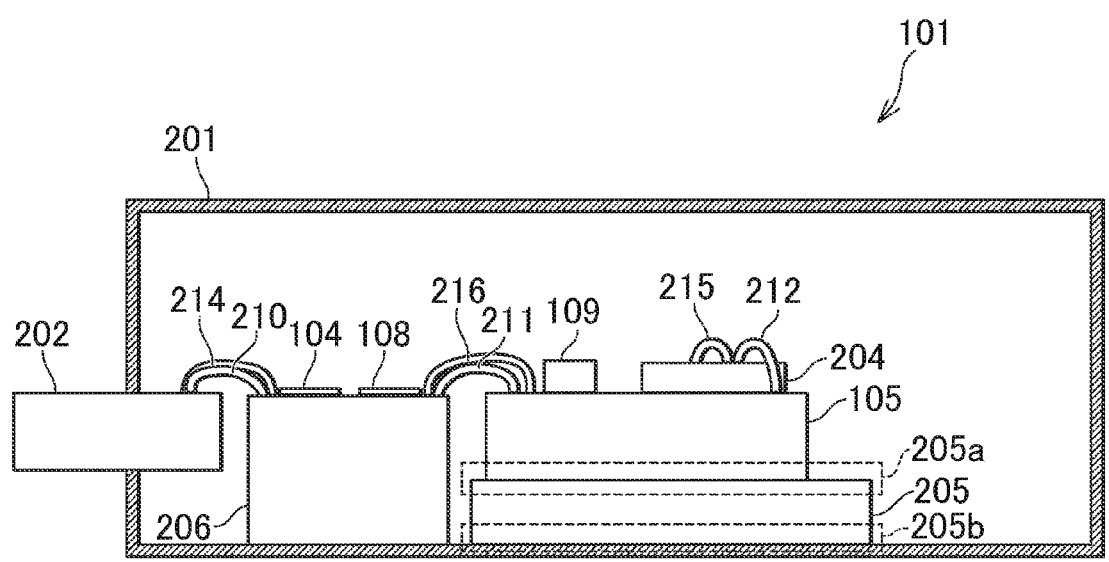
FIG. 5 is an internal side view of an optical transmission module according to a second embodiment of the present invention.

FIG. 5 is an internal side view of an optical transmission module 101 according to a second embodiment of the present invention. Inside the package 201 of the optical transmission module 101 according to this embodiment, the EA modulator integrated laser oscillator 204, the negative-phase terminating resistor 104, the Peltier device 205, the relay substrate 206, the positive-phase terminating resistor 108, the thermistor 109, a plurality of transmission lines, and the substrate 105 are arranged.

In the optical transmission module 101 according to this embodiment, the positive-phase terminating resistor 108 is arranged on the relay substrate 206. The positive-phase terminating resistor 108 and the EA modulator integrated laser oscillator 204 are connected in parallel via a sixth bonding wire 215, a positive-phase transmission line (not shown) formed on the substrate 105, and a seventh bonding wire 216. Other configurations are the same between the optical transmission module 101 according to this embodiment and the optical transmission module according to the first embodiment.

With the optical transmission module 101 according to this embodiment, the positive-phase terminating resistor 108 as well as the negative-phase terminating resistor 104 is arranged outside of the substrate 105 so as to avoid conduction of heat to the first region 205a of the Peltier device 205. Therefore, heat to be transported by the Peltier device 205 is further reduced, and the power consumption of the optical transmission module 101 is further reduced.

Third Embodiment

Figure 6:
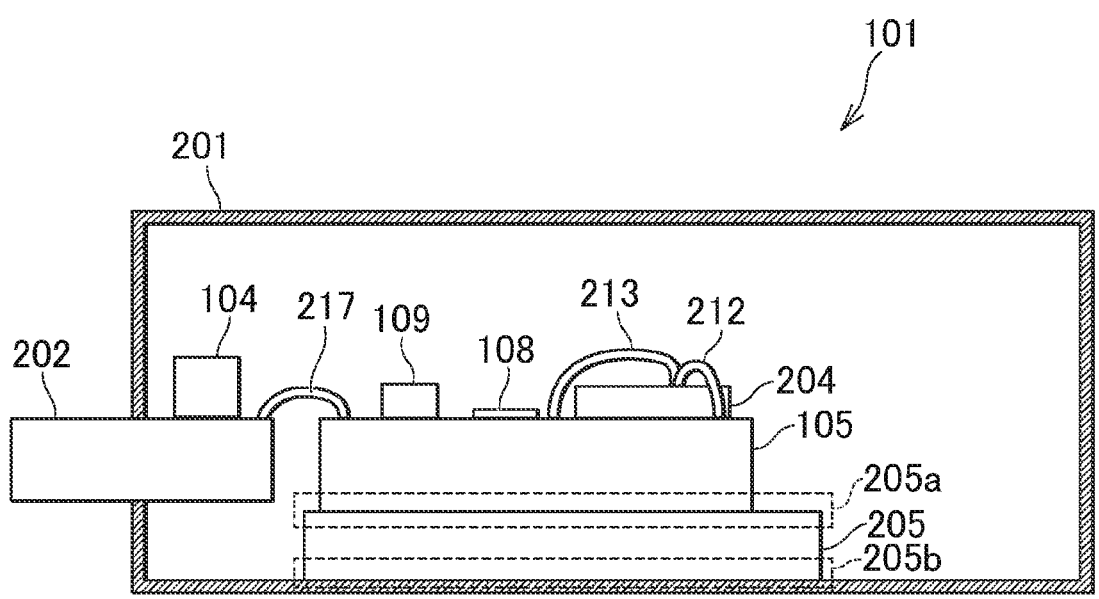
FIG. 6 is an internal side view of an optical transmission module according to a third embodiment of the present invention.

FIG. 6 is an internal side view of an optical transmission module 101 according to a third embodiment of the present invention. Inside the package 201 of the optical transmission module 101 according to this embodiment, the EA modulator integrated laser oscillator 204, the negative-phase terminating resistor 104, the Peltier device 205, the positive-phase terminating resistor 108, the thermistor 109, a plurality of transmission lines, and the substrate 105 are arranged.

In the optical transmission module 101 according to this embodiment, the negative-phase terminating resistor 104 is arranged on the feedthrough 202, and is formed of a chip resistor. Further, a positive-phase transmission line (not shown) formed on the feedthrough 202 and a positive-phase transmission line (not shown) formed on the substrate 105 are connected to each other via an eighth bonding wire 217. Other configurations are the same between the optical transmission module 101 according to this embodiment and the optical transmission module according to the first embodiment.

With the optical transmission module 101 according to this embodiment, while keeping the power consumption equivalent to that in the optical transmission module 101 according to the first embodiment, the number of components to be arranged inside the hermetically-sealed package 201 can be reduced. Therefore, the assembly process can be simplified, and a smaller optical transmission module can be provided.

Fourth Embodiment

Figure 7:
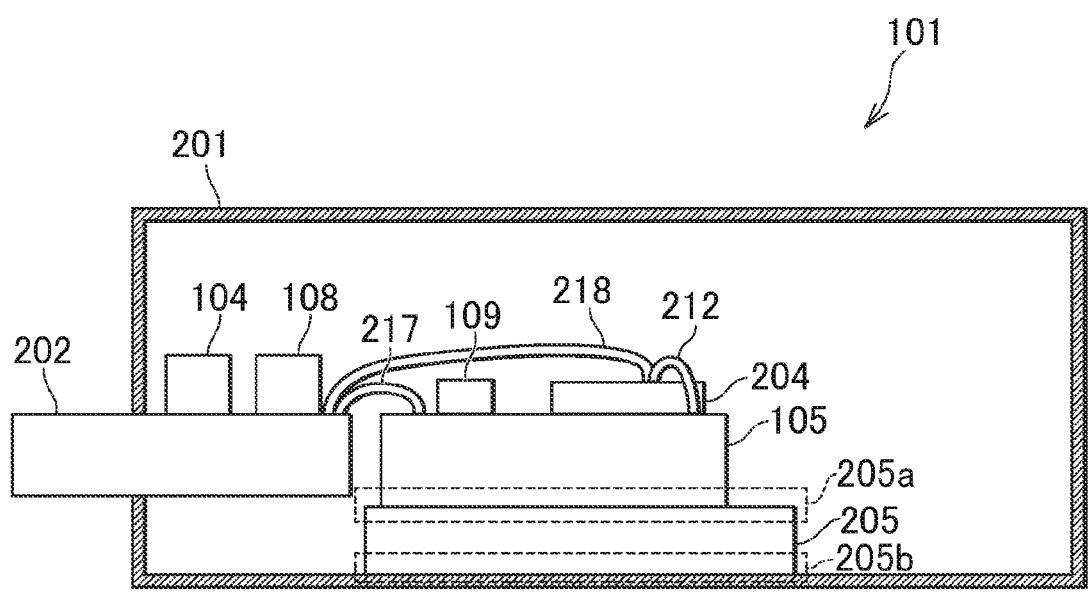
FIG. 7 is an internal side view of an optical transmission module according to a fourth embodiment of the present invention.

FIG. 7 is an internal side view of an optical transmission module 101 according to a fourth embodiment of the present invention. Inside the package 201 of the optical transmission module 101 according to this embodiment, the EA modulator integrated laser oscillator 204, the negative-phase terminating resistor 104, the Peltier device 205, the positive-phase terminating resistor 108, the thermistor 109, a plurality of transmission lines, and the substrate 105 are arranged.

In the optical transmission module 101 according to this embodiment, the negative-phase terminating resistor 104 is arranged on the feedthrough 202, and is formed of a chip resistor. Further, the positive-phase terminating resistor 108 is arranged on the feedthrough 202, and is formed of a chip resistor. The positive-phase transmission line (not shown) formed on the feedthrough 202 and the positive-phase transmission line (not shown) formed on the substrate 105 are connected to each other via the eighth bonding wire 217. Further, the EA modulator integrated laser oscillator 204 and the positive-phase terminating resistor 108 are connected in parallel via a ninth bonding wire 218. Other configurations are the same between the optical transmission module 101 according to this embodiment and the optical transmission module according to the first embodiment.

With the optical transmission module 101 according to this embodiment, the positive-phase terminating resistor 108 is arranged so as to avoid conduction of heat to the first region 205a of the Peltier device 205. Thus, power consumption can be suppressed to be lower than that of the optical transmission module 101 according to the first embodiment. Further, as compared to the optical transmission module 101 according to the first embodiment, the number of components to be arranged inside the hermetically-sealed package 201 can be reduced. Therefore, the assembly process can be simplified, and a smaller optical transmission module further reduced in power consumption can be obtained.

Fifth Embodiment

Figure 8:
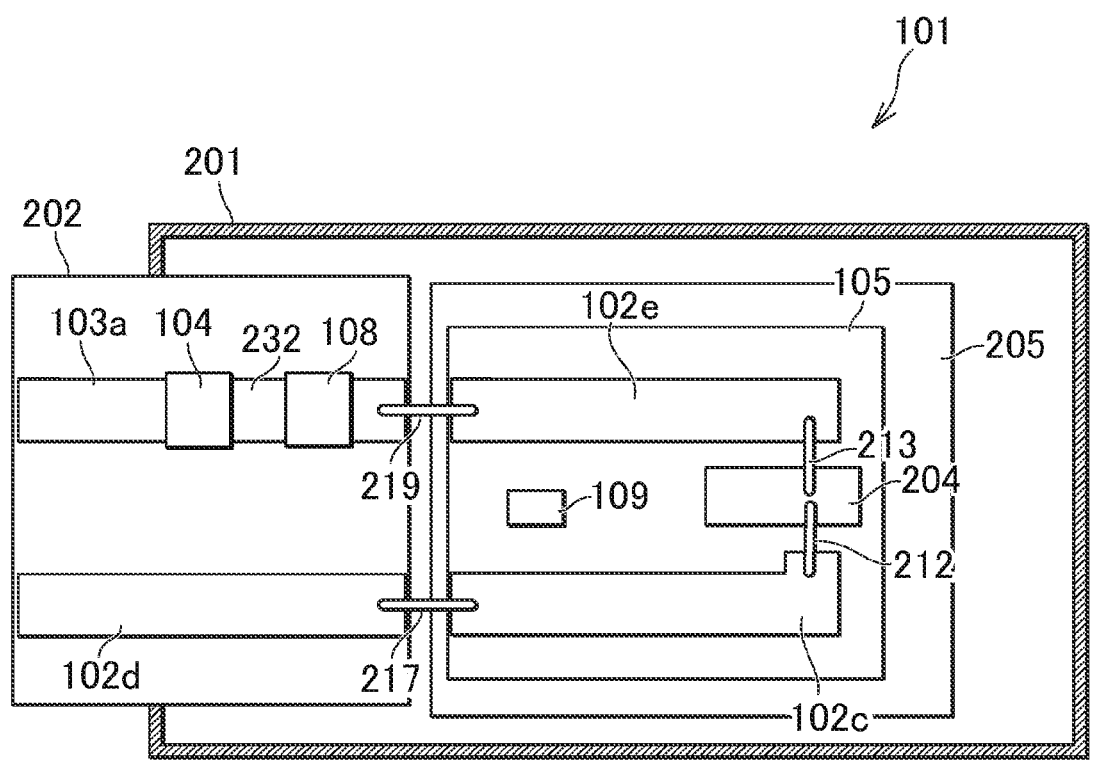
FIG. 8 is an internal top view of an optical transmission module according to a fifth embodiment of the present invention.

FIG. 8 is an internal top view of an optical transmission module 101 according to a fifth embodiment of the present invention. Inside the package 201 of the optical transmission module 101 according to this embodiment, the EA modulator integrated laser oscillator 204, the negative-phase terminating resistor 104, the Peltier device 205, the positive-phase terminating resistor 108, the thermistor 109, and the substrate 105 are arranged. On the feedthrough 202, the first negative-phase transmission line 103a, a third ground pattern 232, and a fourth positive-phase transmission line 102d are formed. Further, on the substrate 105, the third positive-phase transmission line 102c and a fifth positive-phase transmission line 102e are formed.

In the optical transmission module 101 according to this embodiment, the negative-phase terminating resistor 104 is arranged on the feedthrough 202, and is formed of a chip resistor. Further, the positive-phase terminating resistor 108 is arranged on the feedthrough 202, and is formed of a chip resistor. The fourth positive-phase transmission line 102d formed on the feedthrough 202 and the third positive-phase transmission line 102c formed on the substrate 105 are connected to each other via the eighth bonding wire 217. Further, the EA modulator integrated laser oscillator 204 and the fifth positive-phase transmission line 102e formed on the substrate 105 are connected to each other via the sixth bonding wire 215, and the fifth positive-phase transmission line 102e and the positive-phase terminating resistor 108 are connected to each other via a tenth bonding wire 219. The optical transmission module 101 according to this embodiment includes, between the positive-phase terminating resistor 108 and the optical modulator included in the EA modulator integrated laser oscillator 204, a transmission line (fifth positive-phase transmission line 102e) that is impedance matched with each of the optical modulator and the positive-phase terminating resistor 108. Further, the positive-phase terminating resistor 108 and the negative-phase terminating resistor 104 are connected to one ground pattern (third ground pattern 232). Other configurations are the same between the optical transmission module 101 according to this embodiment and the optical transmission module according to the first embodiment.

With the optical transmission module 101 according to this embodiment, the positive-phase terminating resistor 108 is arranged so as to avoid conduction of heat to the first region 205a of the Peltier device 205. Thus, power consumption can be suppressed to be lower than that of the optical transmission module 101 according to the first embodiment. Further, as compared to the optical transmission module 101 according to the first embodiment, the number of components to be arranged inside the hermetically-sealed package 201 can be reduced. Therefore, the assembly process can be simplified, and a smaller optical transmission module further reduced in power consumption can be obtained.

Further, the positive-phase terminating resistor 108 and the optical modulator included in the EA modulator integrated laser oscillator 204 are connected to each other by the impedance-matched transmission line. Thus, unintended signal reflection is prevented, and the operation of the EA modulator integrated laser oscillator 204 can be stabilized. Further, the positive-phase terminating resistor 108 and the negative-phase terminating resistor 104 are connected to one ground pattern. In this manner, the positive-phase terminating resistor 108 and the negative-phase terminating resistor 104 can be arranged close to each other. Thus, the feedthrough 202 can be further downsized to downsize the optical transmission module 101.

Sixth Embodiment

Figure 9:
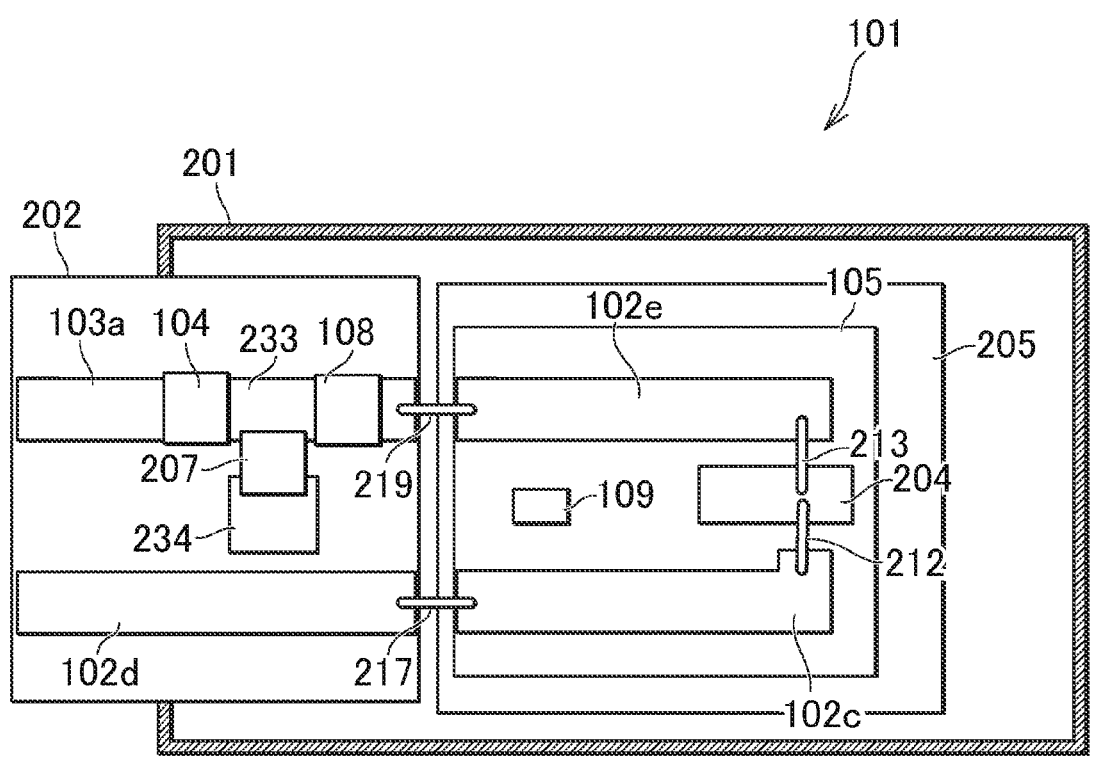
FIG. 9 is an internal top view of an optical transmission module according to a sixth embodiment of the present invention.

FIG. 9 is an internal top view of an optical transmission module 101 according to a sixth embodiment of the present invention. Inside the package 201 of the optical transmission module 101 according to this embodiment, the EA modulator integrated laser oscillator 204, the negative-phase terminating resistor 104, the Peltier device 205, the positive-phase terminating resistor 108, the thermistor 109, a capacitor 207, and the substrate 105 are arranged. On the feedthrough 202, the first negative-phase transmission line 103a, the fourth positive-phase transmission line 102d, a conductor pattern 233, and a fourth ground pattern 234 are formed. Further, on the substrate 105, the third positive-phase transmission line 102c and the fifth positive-phase transmission line 102e are formed.

In the optical transmission module 101 according to this embodiment, the negative-phase terminating resistor 104 is arranged on the feedthrough 202. Further, the positive-phase terminating resistor 108 is arranged on the feedthrough 202.

The fourth positive-phase transmission line 102d formed on the feedthrough 202 and the third positive-phase transmission line 102c formed on the substrate 105 are connected to each other via the eighth bonding wire 217. Further, the EA modulator integrated laser oscillator 204 and the fifth positive-phase transmission line 102e formed on the substrate 105 are connected to each other via the sixth bonding wire 215, and the fifth positive-phase transmission line 102e and the positive-phase terminating resistor 108 are connected to each other via the tenth bonding wire 219. The optical transmission module 101 according to this embodiment includes, between the positive-phase terminating resistor 108 and the optical modulator included in the EA modulator integrated laser oscillator 204, the transmission line (fifth positive-phase transmission line 102e) that is impedance matched with each of the optical modulator and the positive-phase terminating resistor 108. Further, the positive-phase terminating resistor 108 and the negative-phase terminating resistor 104 are connected to one conductor pattern 233, and are connected to one ground pattern (fourth ground pattern 234) via the capacitor 207. Other configurations are the same between the optical transmission module 101 according to this embodiment and the optical transmission module according to the first embodiment.

With the optical transmission module 101 according to this embodiment, the positive-phase terminating resistor 108 is arranged so as to avoid conduction of heat to the first region 205a of the Peltier device 205. Thus, power consumption can be suppressed to be lower than that of the optical transmission module 101 according to the first embodiment. Further, as compared to the optical transmission module 101 according to the first embodiment, the number of components to be arranged inside the hermetically-sealed package 201 can be reduced. Therefore, the assembly process can be simplified, and a smaller optical transmission module further reduced in power consumption can be obtained.

Further, the positive-phase terminating resistor 108 and the optical modulator included in the EA modulator integrated laser oscillator 204 are connected to each other by the impedance-matched transmission line. Thus, unintended signal reflection is prevented, and the operation of the EA modulator integrated laser oscillator 204 can be stabilized. Further, the positive-phase terminating resistor 108 and the negative-phase terminating resistor 104 are connected to the fourth ground pattern 234 via the capacitor 207 so as to prevent DC components of the positive-phase signal 12 and the negative-phase signal 11 from flowing through the positive-phase terminating resistor 108 and the negative-phase terminating resistor 104, respectively. Therefore, power to be consumed by the positive-phase terminating resistor 108 and the negative-phase terminating resistor 104 is reduced, and heat generation in the positive-phase terminating resistor 108 and the negative-phase terminating resistor 104 is suppressed.

Embodiments of the present invention are not limited to those described above. For example, the negative-phase terminating resistor 104 may be arranged on the package 201. Further, the positive-phase terminating resistor 108 may be arranged on the package 201. Further, an example of a box-shaped package called a BOX type is described as the package 201, but as a matter of course, a mode called a CAN type in which the entire package is in a cylindrical shape may be employed. Further, an example in which the inside and the outside of the package are electrically connected to each other by the feedthrough is described, but even when a plurality of lead pins are used, by arranging the relay substrate inside the package and arranging the negative-phase terminating resistor thereon, similar effects to the invention of the present application can be obtained.

While there have been described what are at present considered to be certain embodiments of the invention, it will be understood that various modifications may be made thereto, and it is intended that the appended claims coverall such modifications as fall within the true spirit and scope of the invention.

What is claimed is:

1. An optical transmission module, which is configured to input differential signals comprising a positive-phase signal and a negative-phase signal, the optical transmission module comprising:
   a laser oscillator configured to output laser light;
   an optical modulator configured to modulate the laser light based on the positive-phase signal;
   a negative-phase terminating resistor configured to terminate the negative-phase signal;
   a Peltier device comprising a first region and a second region in which heat is exchanged;
   a substrate mounted to the first region so that heat is conducted to the first region; and
   a package which is hermetically sealed and in which at least the laser oscillator, the optical modulator, the negative-phase terminating resistor, the Peltier device, and the substrate are arranged,
   wherein the laser oscillator and the optical modulator are mounted on the substrate so that heat is conducted to the first region, and
   wherein the negative-phase terminating resistor is arranged outside of the substrate so as to avoid conduction of heat to the first region.

2. The optical transmission module according to claim 1, further comprising:
   a feedthrough configured to pass through the package,
   wherein the negative-phase terminating resistor is arranged on the feedthrough.

3. The optical transmission module according to claim 2, further comprising:
   a positive-phase terminating resistor configured to terminate the positive-phase signal,
   wherein the positive-phase terminating resistor is arranged on the feedthrough.

4. The optical transmission module according to claim 1, further comprising:
   a feedthrough configured to pass through the package; and
   a relay substrate arranged inside the package,
   wherein the negative-phase terminating resistor is arranged on the relay substrate.

5. The optical transmission module according to claim 4, further comprising:
   a positive-phase terminating resistor configured to terminate the positive-phase signal,
   wherein the positive-phase terminating resistor is arranged on the relay substrate.

6. The optical transmission module according to claim 3, further comprising:
   a transmission line arranged between the optical modulator and the positive-phase terminating resistor and configured to be impedance matched with each of the optical modulator and the positive-phase terminating resistor.

7. The optical transmission module according to claim 5, further comprising:
   a transmission line arranged between the optical modulator and the positive-phase terminating resistor and configured to be impedance matched with each of the optical modulator and the positive-phase terminating resistor.

8. The optical transmission module according to claim 1, further comprising:
a transmission line configured to transmit the input positive-phase signal to the optical modulator and configured to be impedance matched with the optical modulator.

9. The optical transmission module according to claim 3, wherein the positive-phase terminating resistor and the negative-phase terminating resistor are connected to one ground pattern.

10. The optical transmission module according to claim 5, wherein the positive-phase terminating resistor and the negative-phase terminating resistor are connected to one ground pattern.

11. The optical transmission module according to claim 9, wherein the positive-phase terminating resistor and the negative-phase terminating resistor are connected to one conductor pattern, and are connected to the one ground pattern via a capacitor.

12. The optical transmission module according to claim 10, wherein the positive-phase terminating resistor and the negative-phase terminating resistor are connected to one conductor pattern, and are connected to the one ground pattern via a capacitor.

13. The optical transmission module according to claim 1, wherein the negative-phase terminating resistor comprises one of a chip resistor and a thin film resistor.

14. An optical transceiver, comprising:
an optical transmission module configured to input differential signals comprising a positive-phase signal and a negative-phase signal;
an optical reception module; and
a driver configured to output the differential signals,
the optical transmission module comprising:
a laser oscillator configured to output laser light;
an optical modulator configured to modulate the laser light based on the positive-phase signal;
a negative-phase terminating resistor configured to terminate the negative-phase signal;
a Peltier device comprising a first region and a second region in which heat is exchanged;
a substrate mounted to the first region so that heat is conducted to the first region; and
a package which is hermetically sealed and in which at least the laser oscillator, the optical modulator, the negative-phase terminating resistor, the Peltier device, and the substrate are arranged,
wherein the laser oscillator and the optical modulator are mounted on the substrate so that heat is conducted to the first region,
wherein the negative-phase terminating resistor is arranged outside of the substrate so as to avoid conduction of heat to the first region, and
wherein the driver is arranged outside of the package.

15. The optical transceiver according to claim 14, wherein the optical transceiver is not hermetically sealed outside of the hermetically sealed package.

* * * * *